United States Patent
Radovanov et al.

(10) Patent No.: US 11,600,473 B2
(45) Date of Patent: *Mar. 7, 2023

(54) ION SOURCE WITH BIASED EXTRACTION PLATE

(71) Applicant: Applied Materials, Inc., Santa Clara, CA (US)

(72) Inventors: Svetlana B. Radovanov, Brookline, MA (US); Bon-Woong Koo, Andover, MA (US); Alexandre Likhanskii, Malden, MA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/150,031

(22) Filed: Jan. 15, 2021

(65) Prior Publication Data

US 2021/0134569 A1    May 6, 2021

Related U.S. Application Data

(63) Continuation-in-part of application No. 16/351,956, filed on Mar. 13, 2019, now Pat. No. 10,923,306.

(51) Int. Cl.
    *H01J 37/32*      (2006.01)
    *H01J 37/24*      (2006.01)
    *H01J 37/08*      (2006.01)

(52) U.S. Cl.
    CPC ........ *H01J 37/32862* (2013.01); *H01J 37/08* (2013.01); *H01J 37/24* (2013.01)

(58) Field of Classification Search
    CPC ...... H01J 37/32862; H01J 37/24; H01J 37/08; H01J 2237/022; H01J 2237/31701; H01J 27/08; H01J 27/024

See application file for complete search history.

(56) References Cited

U.S. PATENT DOCUMENTS 6,356,026 B1    3/2002   Murto
7,459,704 B2   12/2008   Olson et al.
(Continued)

FOREIGN PATENT DOCUMENTS

CN      105655217 A    6/2016
JP      2010-73387 A    4/2010
(Continued)

OTHER PUBLICATIONS

International Search Report and Written Opinion dated Jun. 9, 2020 in corresponding PCT application No. PCT/2020/018072.

*Primary Examiner* — Minh D A
(74) *Attorney, Agent, or Firm* — Nields, Lemack & Frame, LLC

(57) ABSTRACT

An ion source having an electrically isolated extraction plate is disclosed. By isolating the extraction plate, a different voltage can be applied to the extraction plate than to the body of the arc chamber. By applying a more positive voltage to the extraction plate, more efficient ion source operation with higher plasma density can be achieved. In this mode the plasma potential is increased, and the electrostatic sheath reduces losses of electrons to the chamber walls. By applying a more negative voltage, an ion rich sheath adjacent to the extraction aperture can be created. In this mode, conditioning and cleaning of the extraction plate is achieved via ion bombardment. Further, in certain embodiments, the voltage applied to the extraction plate can be pulsed to allow ion extraction and cleaning to occur simultaneously.

20 Claims, 7 Drawing Sheets

(56) References Cited

U.S. PATENT DOCUMENTS

| | | | |
|---|---|---|---|
| 7,700,925 B2 | 4/2010 | Radovanov et al. | |
| 7,834,554 B2 | 11/2010 | Horsky | |
| 9,232,628 B2 | 1/2016 | Radovanov et al. | |
| 9,288,889 B2 | 3/2016 | Radovanov et al. | |
| 9,297,063 B2 | 3/2016 | Radovanov et al. | |
| 9,899,193 B1 | 2/2018 | Koo et al. | |
| 9,916,966 B1* | 3/2018 | Buonodono | H01J 27/024 |
| 10,923,306 B2* | 2/2021 | Radovanov | H01J 27/08 |
| 2006/0272776 A1* | 12/2006 | Horsky | C23C 14/564 |
| | | | 156/345.37 |
| 2007/0089833 A1 | 4/2007 | Inouchi et al. | |
| 2007/0210260 A1* | 9/2007 | Horsky | H01J 37/3171 |
| | | | 250/424 |
| 2008/0223409 A1* | 9/2008 | Horsky | H01J 37/304 |
| | | | 134/166 R |
| 2009/0014667 A1* | 1/2009 | Hahto | H01J 37/08 |
| | | | 250/492.21 |
| 2013/0249400 A1 | 9/2013 | Sato | |
| 2014/0041684 A1 | 2/2014 | Kurunczi et al. | |
| 2014/0099430 A1 | 4/2014 | Levay et al. | |
| 2014/0179090 A1 | 6/2014 | Sinha et al. | |
| 2016/0086759 A1* | 3/2016 | Horsky | H01J 37/00 |
| | | | 315/111.21 |
| 2018/0218894 A1* | 8/2018 | Likhanskii | H01J 49/061 |
| 2018/0254166 A1 | 9/2018 | Kawaguchi | |
| 2020/0090916 A1 | 3/2020 | Patel et al. | |
| 2020/0294750 A1 | 9/2020 | Radovanov et al. | |

FOREIGN PATENT DOCUMENTS

| | | |
|---|---|---|
| JP | 2014-110136 A | 6/2014 |
| JP | 2016-500898 A | 1/2016 |
| JP | 2016-511504 A | 4/2016 |
| JP | 2017-54707 A | 3/2017 |
| TW | 201401323 A | 1/2014 |

* cited by examiner

ION SOURCE WITH BIASED EXTRACTION PLATE

This application is a continuation-in-part of U.S. patent application Ser. No. 16/351,956, filed Mar. 13, 2019, the disclosure of which is incorporated by reference in its entirety.

FIELD

Embodiments of the present disclosure relate to an ion source, and more particularly, an indirectly heated cathode ion source with an electrically isolated extraction plate that can be biased independently of the body of the arc chamber.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In other embodiments, a cold cathode may be disposed on the opposite end of the arc chamber. In some embodiments, a magnetic field is used to further confine the electrons within the arc chamber. A plurality of sides is used to connect the two ends of the arc chamber.

An extraction aperture is disposed along one of these sides, proximate the center of the arc chamber, through which the ions created in the arc chamber may be extracted.

Plasma ion sources operate by providing RF energy into a plasma chamber. The plasma chamber comprises a plurality of sides, wherein one of these sides may include a dielectric window. An antenna may be disposed on the outside of the plasma chamber, such as proximate the dielectric window. A RF power supply is in communication with the antenna such that the antenna introduces RF energy into the plasma chamber. This RF energy ionizes the feedgas, creating a plasma. Like the IHC ion source, the plasma ion source comprises an extraction aperture disposed along one of the sides, proximate the center of the plasma chamber, through which the ions created in the plasma chamber may be extracted.

Ion sources may suffer from some drawbacks. For example, certain ion species may deposit near the extraction aperture, forming whiskers which may cause non-uniformity of the extracted beam. Additionally, the IHC ion source may be inefficient, since plasma density decreases moving from the center of the arc chamber to the extraction aperture.

Therefore, it would be beneficial if there were an IHC ion source that overcame these issues. Further, it would be advantageous if the IHC ion source could easily transition between different modes of operation.

SUMMARY

An ion source having an electrically isolated extraction plate is disclosed. By isolating the extraction plate, a different voltage can be applied to the extraction plate than to the body of the chamber. By applying a more positive voltage to the extraction plate, more efficient ion source operation with higher plasma density can be achieved. In this mode, the plasma potential is increased, and the electrostatic sheath reduces losses of electrons to the chamber walls. By applying a more negative voltage to the extraction plate, an ion rich sheath adjacent to the extraction aperture can be created. In this mode, conditioning and cleaning of the extraction plate is achieved via ion bombardment. Further, in certain embodiments, the voltage applied to the extraction plate can be pulsed to allow ion extraction and cleaning to occur simultaneously.

According to one embodiment, an indirectly heated cathode ion source is disclosed. The indirectly heated cathode ion source comprises a body comprising a plurality of walls connecting a first end and a second end; and an extraction plate comprising an extraction aperture through which ions are extracted, electrically isolated from the body, wherein the body and the extraction plate form a closed volume; and an indirectly heated cathode disposed on the first end of the arc chamber. In certain embodiments, the ion source comprises an extraction power supply in communication with the extraction plate. In some embodiments, the extraction power supply is a bipolar power supply. In certain embodiments, the extraction power supply supplies a pulsed DC voltage to the extraction plate. In certain embodiments, a controller is in communication with the extraction power supply. In certain embodiments, the indirectly heated cathode is electrically connected to the body. In some embodiments, the extraction plate is biased at a different potential than the body.

According to another embodiment, a method of operating the indirectly heated cathode ion source described above is disclosed. The method comprises ionizing a feedgas in the arc chamber; applying a DC voltage to the extraction plate; applying a negative voltage to an electrode disposed outside the arc chamber proximate the extraction aperture to extract ions through the extraction aperture; and applying a cleaning voltage, different from the DC voltage, to the extraction plate, to clean the arc chamber. In certain embodiments, the DC voltage is equal to a voltage applied to the body of the arc chamber. In some embodiments, the DC voltage is more positive than the voltage applied to the body of the arc chamber. In some embodiments, the cleaning voltage is a DC voltage that is more negative than the voltage applied to the body of the arc chamber. In some embodiments, the cleaning voltage comprises a pulsed DC voltage transitioning between a negative voltage and a second voltage, wherein the second voltage is equal to or greater than a voltage applied to the body of the arc chamber. In certain embodiments, the negative voltage is applied to the electrode while the cleaning voltage is being applied to the extraction plate so that ions are extracted while the arc chamber is being cleaned.

According to another embodiment, an indirectly heated cathode ion source is disclosed. The ion source comprises an arc chamber, comprising: a body comprising a plurality of walls connecting a first end and a second end; and an extraction plate comprising an extraction aperture through which ions are extracted, electrically isolated from the body, wherein the body and the extraction plate form a closed volume; an indirectly heated cathode disposed on the first end of the arc chamber; an extraction power supply in communication with the extraction plate; and a controller in communication with the extraction power supply to allow the ion source to operate in a plurality of modes. In certain embodiments, one of the plurality of modes comprises a cleaning mode, wherein during the cleaning mode, ions from within the arc chamber bombard the extraction plate. In certain embodiments, ions are extracted through the extraction aperture during the cleaning mode. In certain embodiments, one of the plurality of modes comprises an enhanced operating mode. In some embodiments, the plasma density at the extraction aperture is increased by at least 30% during the enhanced operating mode. In other embodiments, the plasma density at the extraction aperture is increased by at least 100% during the enhanced operating mode.

According to another embodiment, an indirectly heated cathode ion source is disclosed. The ion source comprises an arc chamber, comprising: a body comprising a plurality of walls connecting a first end and a second end; and an extraction plate comprising an extraction aperture through which ions are extracted, electrically isolated from the body, wherein the body and the extraction plate form a closed volume; an indirectly heated cathode disposed on the first end of the arc chamber; and an extraction power supply in communication with the extraction plate, wherein the extraction power supply supplies a pulsed DC voltage to the extraction plate, wherein the pulsed DC voltage transitions from a negative voltage to a second voltage, wherein the second voltage is equal to or greater than a voltage applied to the body. In certain embodiments, an electrode is disposed outside the arc chamber and proximate the extraction aperture; wherein a negative voltage is applied to the electrode, so that ions are extracted through the extraction aperture while the pulsed DC voltage is applied to the extraction plate.

According to another embodiment, an ion source is disclosed. The ion source comprises a chamber, comprising: a body comprising a plurality of walls; and an extraction plate comprising an extraction aperture through which ions are extracted, electrically isolated from the body, wherein the body and the extraction plate form a closed volume; and an extraction power supply in communication with the extraction plate, wherein the extraction power supply is a bipolar power supply. In certain embodiments, the extraction power supply supplies a pulsed DC voltage to the extraction plate. In certain embodiments, the extraction power supply supplies a pulsed RF voltage to the extraction plate. In some embodiments, the ion source further comprises a controller in communication with the extraction power supply to allow the ion source to operate in a plurality of modes. In certain embodiments, one of the plurality of modes comprises a cleaning mode, wherein during the cleaning mode, the extraction power supply supplies a negative voltage and ions from within the arc chamber bombard the extraction plate. In some embodiments, the ion source further comprises an electrode disposed outside the chamber and proximate the extraction aperture, wherein the electrode is negatively biased relative to the chamber during the cleaning mode such that ions are extracted through the extraction aperture during the cleaning mode. In certain embodiments, one of the plurality of modes comprises an enhanced operating mode. In certain embodiments, a plasma density at the extraction aperture is increased by at least 30% during the enhanced operating mode.

According to another embodiment, an ion source is disclosed. The ion source comprises a chamber, comprising: a body comprising a plurality of walls, wherein the body is electrically conductive; and an extraction plate comprising an extraction aperture through which ions are extracted, at least a portion of which is electrically conductive and electrically isolated from the body, wherein the body and the extraction plate form a closed volume; and an extraction power supply in communication with the at least a portion of the extraction plate; wherein the extraction power supply supplies a negative voltage for a duration of time. In certain embodiments, the ion source further comprises an indirectly heated cathode disposed in the chamber. In some embodiments, the indirectly heated cathode is electrically connected to the body. In some embodiment, the ion source further comprises a controller in communication with the extraction power supply to allow the ion source to operate in a plurality of modes. In certain embodiments, one of the plurality of modes comprises a cleaning mode, wherein during the cleaning mode, the extraction power supply supplies the negative voltage and ions from within the arc chamber bombard the extraction plate. In certain embodiments, the ion source further comprises an electrode disposed outside the chamber and proximate the extraction aperture, wherein the electrode is negatively biased relative to the chamber during the cleaning mode such that ions are extracted through the extraction aperture during the cleaning mode. In certain embodiments, one of the plurality of modes comprises an enhanced operating mode. In some embodiments, a plasma density at the extraction aperture is increased by at least 30% during the enhanced operating mode. In some embodiments, the portion of the extraction plate is exposed and a remainder of the extraction plate facing an interior of the closed volume is coated or covered with a dielectric material. In certain embodiments, the extraction plate comprises a nonconductive plate, having a central opening, affixed to the body; and an electrically conductive plate having the extraction aperture disposed in the central opening, wherein the at least a portion of the extraction plate comprises the electrically conductive plate.

According to another embodiment, an ion source is disclosed. The ion source comprises a chamber, comprising: a body comprising a plurality of walls; and an extraction plate comprising an extraction aperture through which ions are extracted, electrically isolated from the body, wherein the body and the extraction plate form a closed volume, and wherein the extraction plate comprises an electrically conductive portion proximate the extraction aperture and exposed to an interior of the closed volume, and wherein a remainder of the extraction plate facing the interior of the closed volume comprises a non-conductive material; and an extraction power supply in communication with the electrically conductive portion of the extraction plate, wherein application of a voltage to the electrically conductive portion of extraction plate, different from a voltage applied to the body, modifies a gradient of a plasma potential in a vicinity of the extraction aperture. In certain embodiments, the extraction power supply provides a pulsed DC or pulsed RF voltage to the electrically conductive portion.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
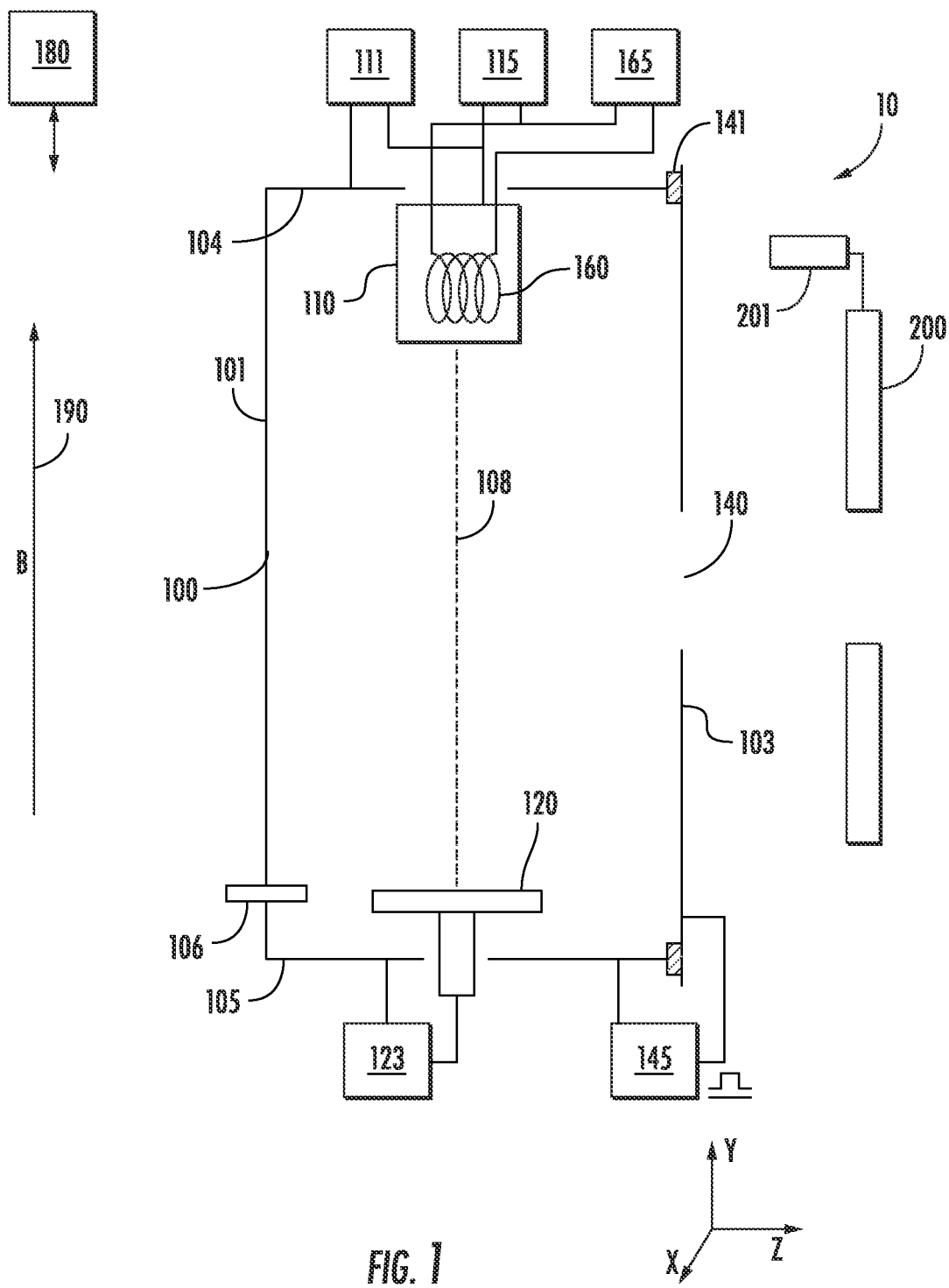
FIG. 1 is an indirectly heated cathode (IHC) ion source in accordance with one embodiment.

FIG. 1 shows an IHC ion source 10 according to one embodiment. The IHC ion source 10 includes an arc chamber 100. The arc chamber 100 has a body, comprising two opposite ends, and walls 101 connecting to these ends. The ends and the walls 101 of the arc chamber 100 may be constructed of an electrically conductive material and may be in electrical communication with one another. In some embodiments, a liner may be disposed proximate one or more of the walls 101. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. In other embodiments, the cathode 110 may be electrically connected to the arc chamber 100, so as to be at the same voltage as the walls 101 of the arc chamber 100. In these embodiments, bias power supply 111 may not be employed and the cathode 110 may be electrically connected to the walls 101 of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the walls 101 of the arc chamber 100. In these embodiments, repeller bias power supply 123 may not be employed and the repeller 120 may be electrically connected to the walls 101 of the arc chamber 100. In still other embodiments, a repeller 120 is not employed.

In yet another embodiment, a cold cathode may be disposed on the second end 105.

The cathode 110 and the repeller 120 are each made of an electrically conductive material, such as a metal or graphite.

The components which comprise the body of the arc chamber 100 are all electrically and mechanically coupled to one another. In other words, the first end 104, the second end 105 and the walls 101 are all at the same electrical potential.

In certain embodiments, a magnetic field 190 is generated in the arc chamber 100. This magnetic field 190 is intended to confine the electrons along one direction. The magnetic field 190 typically runs parallel to the walls 101 from the first end 104 to the second end 105. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

Further, the IHC ion source 10 also comprises a gas inlet 106 through which the feedgas to be ionized may be introduced to the arc chamber 100.

One side of the arc chamber 100 is referred to as the extraction plate 103. The extraction plate 103 includes an extraction aperture 140. In FIG. 1, the extraction aperture 140 is disposed on a side that is parallel to the X-Y plane (perpendicular to the page). The extraction plate 103 is made of an electrically conductive material, such as a metal or graphite.

The extraction plate 103 is electrically isolated from the body of the arc chamber 100 through the use of insulators 141. As noted above, the first end 104, the second end 105 and the chamber walls 101 are maintained at a common potential. This may be ground. However, in other embodiments, these components may be biased using a power supply. The phrase "the body of the arc chamber", as used herein, refers to first end 104, the second end 105 and the chamber walls 101.

As stated above, the extraction plate 103 is electrically isolated from the body of the arc chamber 100 through the use of insulators 141. Specifically, the insulators 141 may separate the extraction plate 103 from two of the chamber walls 101, the first end 104 and the second end 105. These insulators 141 may be constructed of a dielectric material, such as boron nitride (BN), alumina ($Al_2O_3$) and other materials.

When assembled, the extraction plate 103 and the body of the arc chamber 100 form a closed volume. Feedgas enters this closed volume via the gas inlet 106, is ionized in this closed volume and ions exit this closed volume through the extraction aperture 140.

The feedgas that is introduced into the IHC ion source 10 is ionized to form a plasma. This plasma has an electrical potential, referred to as the plasma potential, which is closely related to the electrical potential of the body of the arc chamber 100. For example, if the body of the arc chamber 100 is grounded, the plasma potential will also be close to ground.

The extraction plate 103 is independently biased using extraction power supply 145. In certain embodiments, the extraction power supply 145 is referenced to the body of the arc chamber 100. The extraction power supply 145 may be a bipolar direct current (DC) power supply, capable of supplying voltages to the extraction plate 103 that are positive or negative with respect to the body of the arc chamber 100.

An extraction plate 103 that is positively biased relative to the body of the arc chamber 100 provides efficient ion source operation at higher plasma density. In this mode, because the extraction plate 103 is biased at a higher potential than the plasma potential, the plasma potential is increased near the extraction plate 103, and the electrostatic sheath reduces losses of the electrons to the chamber walls. Thus, the plasma sheath is modified in the vicinity of the extraction aperture 140.

Conversely, an extraction plate 103 that is negatively biased relative to the body of the arc chamber 100 and the plasma potential enables creation of an ion rich sheath adjacent to the extraction aperture 140. Thus, the plasma sheath is modified in the vicinity of the extraction aperture 140. The conditioning and cleaning of the extraction plate is then achieved via ion bombardment. Relatively low DC negative bias voltages, such as but not limited to −50 V to −200 V, can be used for a removal of the deposits on the extraction plate 103. At higher negative DC voltages, such as up to −1000 V and higher, temperature control of the extraction plate 103 is possible.

In certain embodiments, the extraction power supply 145 is capable of providing a pulsed DC voltage. In this special case, simultaneous ion extraction and cleaning of the extraction plate 103 is realized by uniform pulsing using a synchronized pulsing with a DC ion beam extraction.

In another embodiment, a plurality of different power supplies may be in electrical communication with the extraction plate 103 through the use of one or more switches. For example, a first switch may be used to directly connect the extraction plate 103 to the body of the arc chamber 100. In this embodiment, the potential of the extraction plate 103 may be approximately the same as the plasma potential. Additional switches may be used to electrically connect one or more power supplies to the extraction plate 103.

Figure 10A:
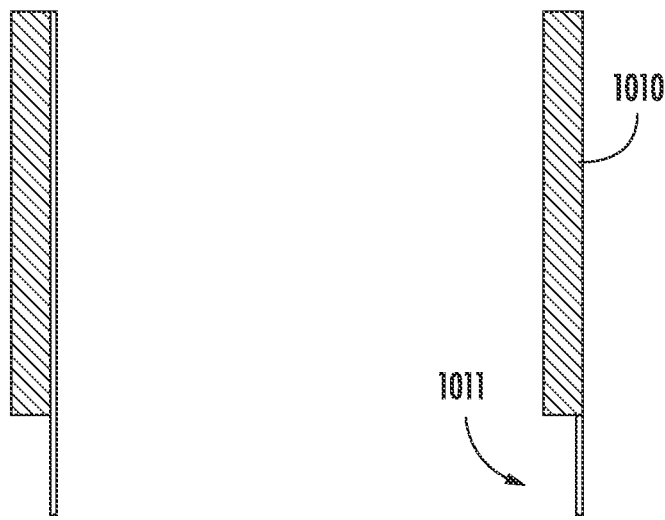
FIGS. 10A-B each show an extraction plate according to another embodiment.

While FIG. 1 shows the extraction plate 103 being an electrically conductive material that is biased by the extraction power supply 145, other embodiments are also possible. For example, in certain embodiments, as shown in FIG. 10A, a portion of the extraction plate 103, such as the portion that is not proximate the extraction aperture 140, may be coated or covered with a dielectric material 1000. The dielectric material 1000 insulates the portion of the extraction plate 103 from the plasma such that the plasma near this portion is not affected by the voltage applied to the extraction plate 103. In this way, the changes to the plasma sheath are localized to the region near the extraction plate 103. Additionally, in certain embodiments, the dielectric material 1000 serves as the insulators 141 (see FIG. 1).

Figure 10B:
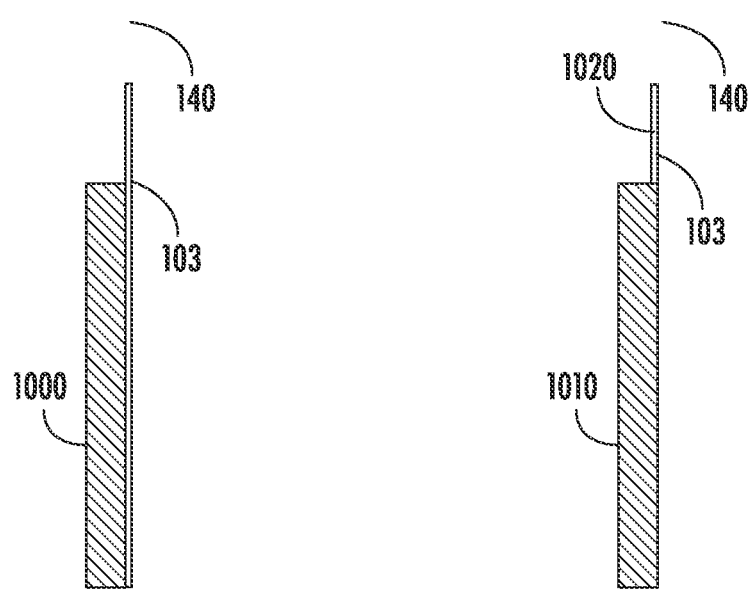

While FIG. 10A shows an extraction plate 103 with a coating of dielectric material 1000, other embodiments are possible. For example, as shown in FIG. 10B, the extraction plate 103 may be made up of several different components. For example, a non-conductive plate 1010 with an opening 1011 may be affixed to the body of the arc chamber 100. A smaller electrically conductive plate 1020 may be disposed in the opening 1011 of the non-conductive plate 1010 and include the extraction aperture 140. In this embodiment, the change to the plasma sheath is localized to the region near the smaller electrically conductive plate 1020.

In both embodiments, the extraction plate 103 comprises an electrically conductive portion that is exposed to the interior of the chamber and affects the gradient of the plasma potential. The remainder of the extraction plate 103 is non-conductive, either through the use of a coating or covering of dielectric material, or through the use of a non-conductive plate 1010. In certain embodiments, the exposed electrically conductive portion comprises less than 50% of the total surface area of the extraction plate and is disposed near the extraction aperture 140. In other embodiments, the exposed electrically conductive portion comprises less than 30% of the total surface area of the extraction plate and is disposed near the extraction aperture 140. In other embodiments, the exposed electrically conductive portion comprises less than 20% of the total surface area of the extraction plate and is disposed near the extraction aperture 140. In other embodiments, the exposed electrically conductive portion comprises less than 10% of the total surface area of the extraction plate and is disposed near the extraction aperture 140. The electrically conductive portion is in communication with the extraction power supply 145.

One or more electrodes 200 may be disposed outside the arc chamber 100 proximate the extraction aperture 140. When a negative voltage is applied to the electrodes 200, positive ions from within the IHC ion source 10 are accelerated through the extraction aperture 140 and toward the workpiece, which is located downstream from the electrodes 200. Each electrode may be a single electrically conductive component with an aperture disposed therein. The electrodes 200 may be a metal, such as tungsten, molybdenum or titanium. An electrode power supply 201 may be used to bias the one or more of the electrodes 200 relative to the body of the arc chamber 100 so as to attract ions through the extraction aperture 140.

A controller 180 may be in communication with one or more of the power supplies such that the voltage or current supplied by these power supplies may be modified. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein. For example, the controller 180 may be in communication with the extraction power supply 145 to allow the IHC ion source 10 to enter the modes described below. The controller 180 may also be in communication with the electrode power supply 201 to bias the electrodes as described herein.

Figure 9:
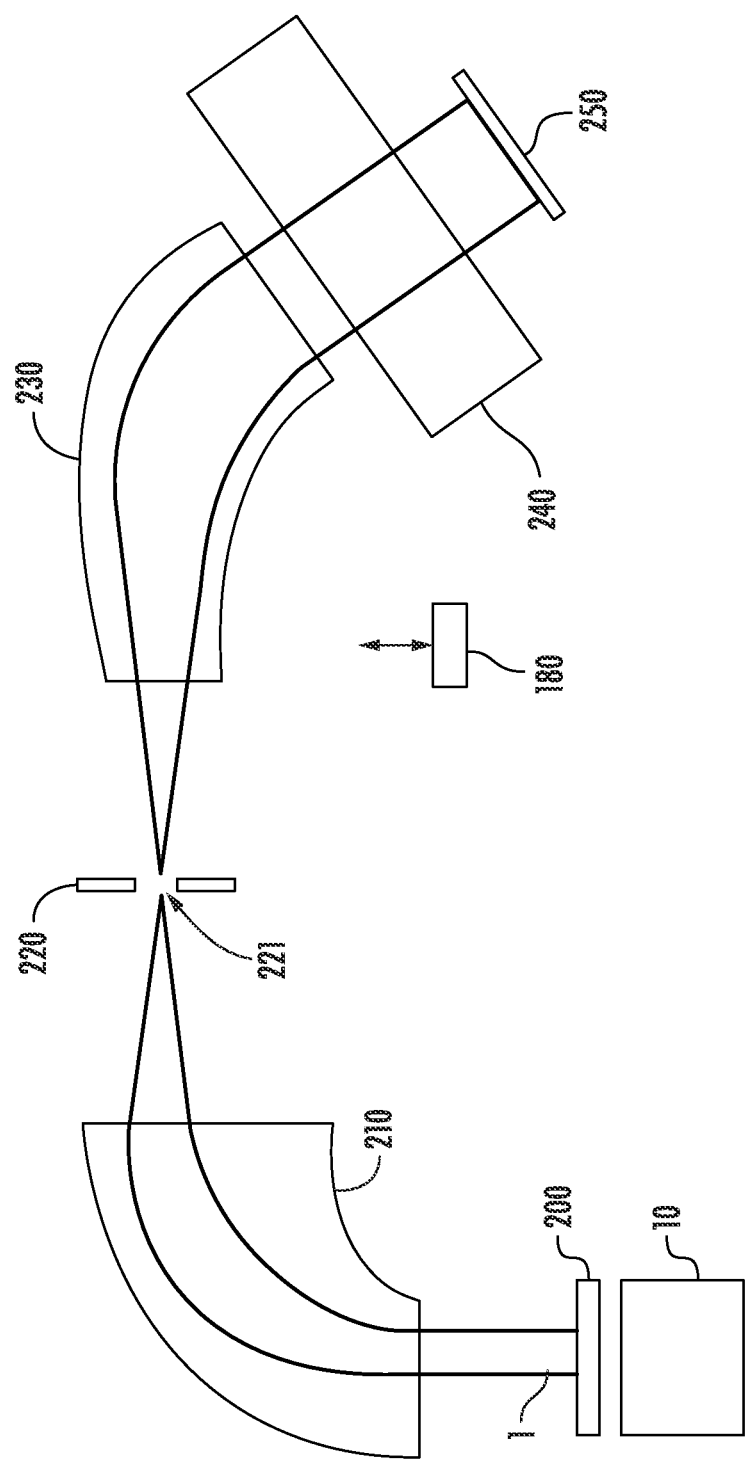
FIG. 9 shows an ion implantation system utilizing the IHC ion source of FIG. 1.

FIG. 9 shows an ion implantation system using the IHC ion source 10 of FIG. 1. As shown in FIG. 1, disposed outside and proximate the extraction aperture of the IHC ion source 10 is one or more electrodes 200.

Located downstream from the electrodes 200 is a mass analyzer 210. The mass analyzer 210 uses magnetic fields to guide the path of the extracted ions 1. The magnetic fields affect the flight path of ions according to their mass and charge. A mass resolving device 220 that has a resolving aperture 221 is disposed at the output, or distal end, of the mass analyzer 210. By proper selection of the magnetic fields, only those ions 1 that have a selected mass and charge will be directed through the resolving aperture 221. Other ions will strike the mass resolving device 220 or a wall of the mass analyzer 210 and will not travel any further in the system.

A collimator 230 may disposed downstream from the mass resolving device 220. The collimator 230 accepts the ions 1 that pass through the resolving aperture 221 and creates a ribbon ion beam formed of a plurality of parallel or nearly parallel beamlets. The output, or distal end, of the mass analyzer 210 and the input, or proximal end, of the collimator 230 may be a fixed distance apart. The mass resolving device 220 is disposed in the space between these two components.

Located downstream from the collimator 230 may be an acceleration/deceleration stage 240. The acceleration/deceleration stage 240 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 240 is the workpiece 250.

Returning to FIG. 1, the inclusion of an electrically isolated extraction plate 103 and an extraction power supply 145 allows the ability to operate the IHC ion source 10 in a plurality of different modes.

In a first mode, referred to as conventional operating mode, the extraction plate 103 is maintained at the same potential as the body of the arc chamber 100. Additionally, the electrode 200 is negatively biased in this mode to extract the ions from the IHC ion source 10. Thus, the extraction plate 103 is at approximately the same potential as the plasma potential.

It has been found that there may be some shortcomings associated with conventional operating mode. For example, testing has shown that the IHC ion source 10 is inefficient since the plasma density exhibits a steep gradient moving from the center 108 of the arc chamber 100 toward the extraction aperture 140 along the Z-direction. For example, the ion density at the extraction aperture 140 may be 10% of the ion density at the center 108 of the arc chamber 100.

Additionally, deposition on the repeller 120 and the chamber walls 101 can cause short-circuiting between the cathode 110 and the chamber walls 101. More specifically, the plasma potential in conventional operating mode is about 4 eV, while the electron temperature is about 8 eV. This allows the electrons to travel easily along magnetic fields and be lost to the first end 104 and the second end 105.

Further, whisker growth on the extraction aperture 140 degrades ion beam uniformity. Whicker growth may occur when the feedgas is carbon or a carbon-containing species. These conditions limit the lifetime of the IHC ion source 10 and increase the possibility of glitching.

The inclusion of an electrically isolated extraction plate 103 and an extraction power supply 145 allows modes of operation that address the shortcomings noted above.

The second mode of operation is referred to as enhanced operating mode. In the enhanced operating mode, the extraction plate 103 is biased at a positive voltage relative to the body of the arc chamber 100. This mode provides for more efficient beam operation, enhanced plasma density and dopant fractionation at a given source power. Thus, in this embodiment, the extraction plate 103 is based at a higher voltage than the plasma potential. Specifically, the plasma is disposed in an arc chamber 100 that is defined by the body and the extraction plate 103. The body is at a lower voltage than the extraction plate 103. Consequently, the plasma potential is higher near the extraction plate 103 than in other regions in the arc chamber 100. This increase in plasma potential is due solely to the extraction plate 103.

In enhanced operating mode, the extraction plate 103 may be biased at about 50V to 100V relative to the body of the arc chamber 100. Of course, other voltages may also be used. This bias serves to drain electrons from the plasma, increasing the overall plasma potential and plasma density. The plasma potential gradient may be less unaffected in other regions of the arc chamber 100. Rather, the plasma potential gradient is mainly modified near the extraction plate 103. This serves to create an electron rich sheath, especially near the extraction aperture 140. The electrostatic sheath will also reduce the loss of electrons to the first end 104 and the second end 105. Instead, electrons will be attracted toward the extraction plate 103. However, the electrons are somewhat restricted in this direction due to the magnetic field 190.

The enhanced electron diffusion toward the extraction plate 103 serves to increase the plasma density near the extraction aperture 140. Specifically, the electron diffusion enhances ionization of the feed gas near the extraction plate 103. In one test, a voltage of 60V was applied to the extraction plate 103 relative to the body of the arc chamber 100. An increase in plasma density of over 100% was measured near the extraction aperture 140. An increase in plasma density of 30% was measured at the center 108 of the arc chamber 100. Thus, plasma density near the extraction aperture 140 is increased by at least 305 by using enhanced operating mode.

The enhanced operating mode results in higher fractionation at higher plasma density and lower source power for monomer ion production. Additionally, in enhanced operating mode, the electrode 200 is negatively biased to extract the ions from the IHC ion source 10.

Selection of an appropriate positive voltage to be used in enhanced operating mode may include consideration of many factors. Specifically, as the positive voltage is increased, the plasma density proximate the extraction aperture 140 continues to increase. However, as the positive voltage is increased, more electrons may collide with the extraction plate 103, raising its temperature. In certain embodiments, the maximum temperature of the extraction plate 103 may be limited by the physical properties of the extraction plate 103. For example, the temperature may be maintained at a temperature below the melting point of the extraction plate 103. Furthermore, increased temperature of the extraction plate 103 may result in increased temperature of the plasma itself. This may affect the fractionation of the ions and the ion species that are formed. Thus, the appropriate positive voltage for enhanced operating mode may be a function of the feedgas, the extraction plate material, the desired ion species and other considerations.

The third mode is referred to as cleaning mode. In cleaning mode, the extraction plate 103 is negatively biased relative to the body of the arc chamber 100. In certain embodiments, the extraction plate 103 may be negatively biased between 100V and 500V relative to the body of the arc chamber 100, although other voltages may be used. Thus, in the cleaning mode, the extraction plate 103 is biased at a lower voltage than the plasma potential.

In this cleaning mode, an ion rich sheath is created near the extraction aperture 140. The cleaning of the extraction plate 103 is achieved via ion bombardment. Specifically, since the extraction plate 103 is negatively biased relative to the body of the arc chamber 100 and the plasma potential, positive ions are accelerated toward the extraction plate 103. The bombardment of positive ions serves to sputter material from the extraction plate 103. Furthermore, the bombardment of positive ions also serves to increase the temperature of the extraction plate 103. Thus, the negative voltage applied to the extraction plate 103 serves as an extra control knob for suppressing whisker growth and/or deposition, if desired.

Selection of an appropriate negative voltage to be used in cleaning mode may include consideration of many factors.

Specifically, as the negative voltage becomes more negative, the number and velocity of the positive ions striking the extraction plate 103 increases. A sufficiently negative voltage may cause the positive ions to sputter the extraction plate itself, rather than the depositions on the extraction plate 103. Further, bombardment of the extraction plate 103 also raises the temperature of the extraction plate 103. Thus, the magnitude of the negative voltage and its duration are criteria that are considered to insure that the extraction plate 103 is not damaged during the cleaning mode.

In certain embodiments, the electrode 200 is positively biased relative to the body of the arc chamber 100 in the cleaning mode to suppress the extraction of ions from the IHC ion source 10. However, in other embodiments, the electrode is negatively biased so that positive ions may be extracted from the IHC ion source in the cleaning mode.

Figure 2:
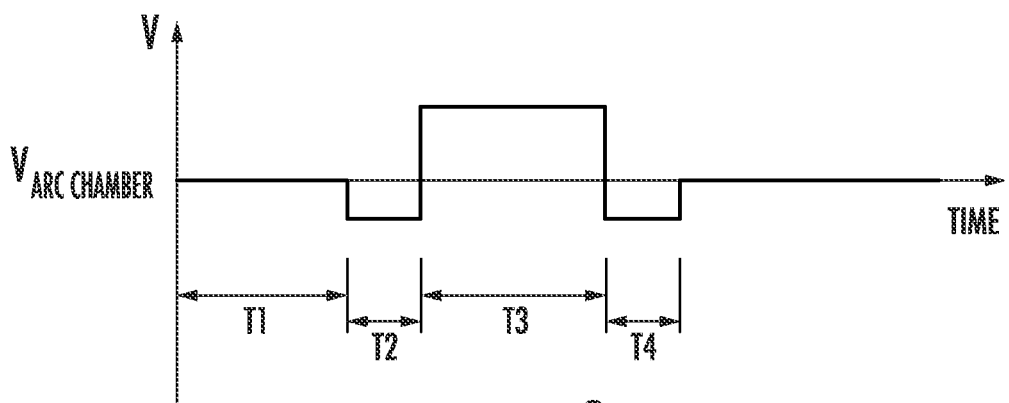
FIG. 2 shows a timing diagram showing the different modes of operation according to one embodiment.

These various modes can be invoked in a variety of ways. For example, FIG. 2 shows a timing diagram where the voltage applied to the extraction plate 103, as referenced to the body of the arc chamber 100, is shown on the vertical axis. The horizontal axis represents time. In this representative diagram, the IHC ion source 10 begins operation in conventional operating mode for a duration T1. This mode may be useful for the extraction of certain ion species. After this duration of time, it may be desirable to clean the extraction plate 103. This may be achieved by applying a negative voltage to the extraction plate 103 for a duration T2. As described above, the negative voltage causes positive ions from within the arc chamber 100 to accelerate toward the extraction plate 103, resulting in the sputtering of material that was previously deposited on the extraction plate 103.

After the cleaning process is completed, the IHC ion source 10 may return to one of the operating modes. For example, the IHC ion source 10 may enter the enhanced operating mode for a duration T3. This is achieved by applying a positive voltage to the extraction plate 103. In a different embodiment, the IHC ion source 10 may return to conventional operating mode. After the duration T3, the IHC ion source 10 may again be cleaned. The duration T3 may be equal to or different from the duration T1. A negative voltage is then again applied to the extraction plate 103 during duration T4.

This sequence, where an operating mode is followed by the cleaning mode, can continue indefinitely. In one embodiment, the controller 180 may monitor an amount of time that has passed since the last cleaning and invoke the cleaning mode. In other embodiments, the cleaning mode may be invoked when the recipe used by the IHC ion source 10 is changed. Of course, other criteria may also be used to determine when the cleaning mode is invoked.

Additionally, as described above, in certain embodiments, the voltage applied to the extraction plate 103 may be pulsed. The modes described herein may be invoked at various times using a pulsed DC power supply. Some examples are shown in FIGS. 3-7. In each of these figures, the vertical axis represents the voltage applied to the extraction plate 103 as referenced to the body of the arc chamber 100. The horizontal axis represents time.

Figure 3:
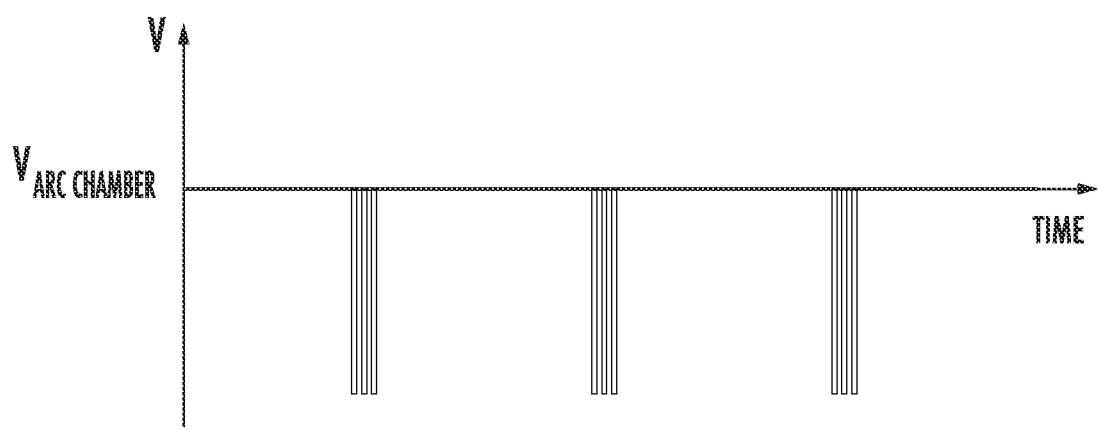
FIG. 3 shows a timing diagram showing the cleaning of an IHC ion source according to one embodiment.

In certain embodiments, as shown in FIG. 3, the cleaning mode may be invoked between processes. In one embodiment, the IHC ion source 10 may be operated in conventional operating mode for a period of time. In this mode, the voltage applied to the extraction plate 103 is the same as that applied to the body of the arc chamber 100. After this period of time, it may be determined that the interior of the IHC ion source 10 be cleaned. Thus, the cleaning mode is invoked by applying a pulsed negative voltage relative to the body of the arc chamber 100 to the extraction plate 103. After the cleaning is completed, the IHC ion source 10 returns to either conventional or enhanced operating mode. The process performed after the cleaning mode may use the same recipe as was used prior to the cleaning mode, or may be a different recipe. In this example, the default voltage applied to the extraction plate 103 may be the same as the voltage applied to the body, while negative pulses are used to clean the extraction plate 103.

In one embodiment, the controller 180 may monitor an amount of time that has passed since the last cleaning and invoke the cleaning mode. In other embodiments, the cleaning mode may be invoked when the recipe used by the IHC ion source 10 is changed. In certain embodiments, the cleaning mode may be an extended period of time during which the voltage applied to the extraction plate 103 remains negative, as shown in FIG. 2.

In certain embodiments, shown in FIG. 3, the cleaning mode may be an extended period of time during which the voltage applied to the extraction plate 103 is pulsed so as to transition between a negative voltage and a second voltage, which may be equal to the voltage applied to the body of the arc chamber 100. In other embodiments, shown in FIG. 4, the cleaning mode may be an extended period of time during which the voltage applied to the extraction plate 103 is pulsed so as to transition between a negative voltage and a second voltage, which is greater than the voltage applied to the body of the arc chamber 100. This second voltage may be up to 100V or greater. These bipolar pulses are used to accelerate electrons during the positive pulse to heat the plasma aperture and to accelerate ions during the negative pulse to sputter the deposits from the plasma aperture. The amplitude, frequency, and duty cycle of the pulses can be tuned and adjusted depending upon a particular plasma conditions. In this example, the default voltage applied to the extraction plate 103 may be the same as the voltage applied to the body, while negative and positive pulses are used to clean the extraction plate 103. In certain embodiments, ion implantation is not performed during the cleaning mode. In other words, the voltage to the electrodes 200 disposed outside the extraction aperture 140 may be neutral or positive relative to the IHC ion source 10 to suppress the extraction of ions.

In one embodiment, the pulsed DC voltage may transition between a negative voltage, such as −100V to −1000V, and a second voltage. The second voltage may be the same as that applied to the body of the arc chamber 100, or may be greater than that voltage. The frequency of this pulsed voltage may be greater than 0.1 kHz and may be in the MHz range. The amount of erosion experienced by the extraction plate 103 is a function of the amplitude, frequency and duty cycle of the pulsed DC voltage.

In other embodiments, ion implantation is performed during the cleaning mode. In other words, the voltage to the electrodes 200 disposed outside the extraction aperture 140 may be negative relative to the IHC ion source 10. In some embodiments, the default voltage applied to the extraction plate 103 may be the same as the voltage applied to the body so that the IHC ion source 10 operates in conventional operating mode. In certain embodiments, the default voltage applied to the extraction plate 103 may be greater than the voltage applied to the body so as to operate in enhanced operating mode. Pulses are then used to invoke cleaning mode.

Figure 4:
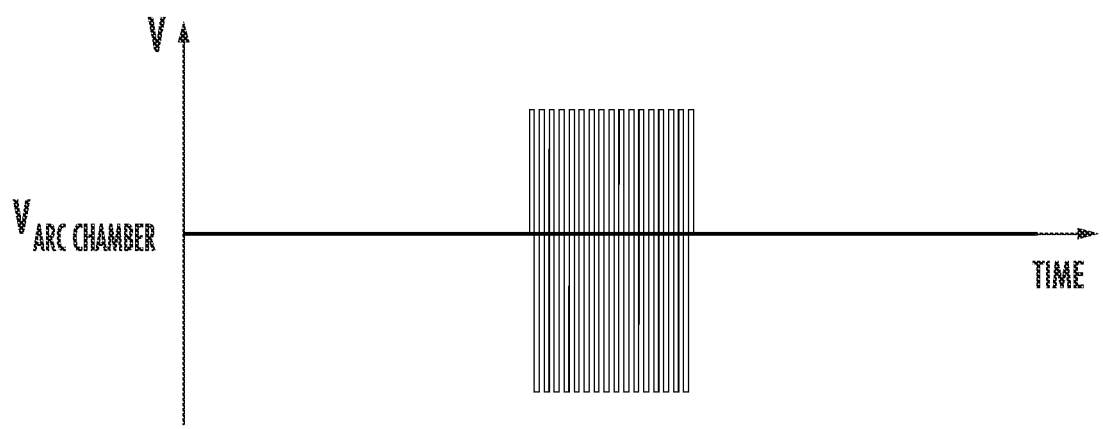
FIG. 4 shows a timing diagram showing the cleaning of an IHC ion source according to a second embodiment.
Figure 5:
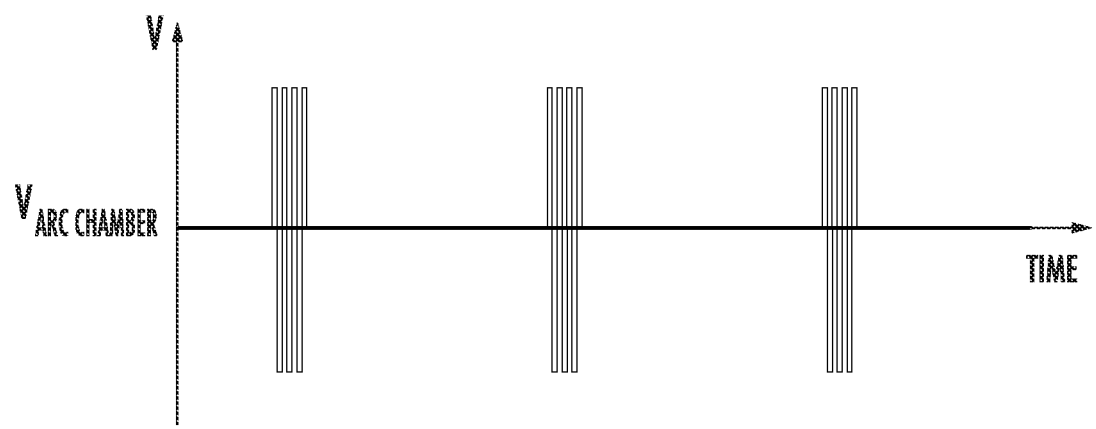
FIG. 5 shows a timing diagram showing the cleaning of an IHC ion source while ions are being extracted according to one embodiment.

The use of a pulsed DC voltage allows the extraction of ions to continue during the cleaning mode. In one embodiment, the pulsed DC voltage may transition between a negative voltage, such as −100V to −1000V, and a second voltage. The second voltage may be the same as that applied to the body of the arc chamber 100, or may be greater than that voltage. The frequency of this pulsed voltage may be greater than 0.1 kHz and may be in the MHz range. Since the mass of electrons is so much less than the mass of positive ions, the electrons respond much quicker to changes in the voltage applied to the extraction plate 103. Thus, rapid transitions in this voltage may minimally affect the positive ions in the IHC ion source 10. Thus, an ion beam can be extracted from the IHC ion source 10, even when cleaning mode is used. FIG. 5 is similar to FIG. 4, except that the voltage applied to the electrode 200 remains negative so as to extract ions even during the cleaning mode. Further, the frequency of the pulsed DC voltage may be greater when ions are being extracted during the cleaning mode. For example, the use of very high frequency pulses, such as greater than 1 MHz, for cleaning mode insures that the extraction of ions is uninterrupted and that the short pulses are transparent to the extraction of an ion beam and to source operation.

Figure 6:
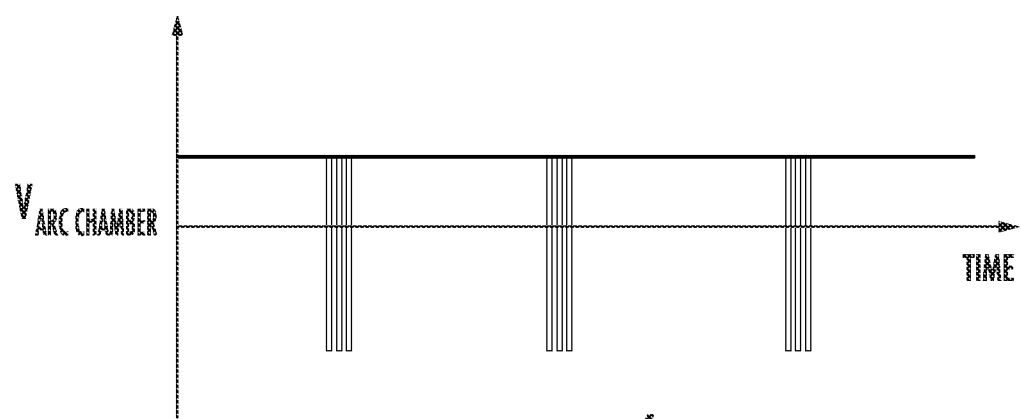
FIG. 6 shows a timing diagram showing the cleaning of an IHC ion source while ions are being extracted according to a second embodiment.

In another embodiment, shown in FIG. 6, the voltage applied to the extraction plate 103 may be positive so as to employ the enhanced operating mode. Negative DC pulses are then applied to clean the extraction plate 103 during enhanced operation. For example, application of a voltage of about +60V to the extraction plate 103 can be used together with the short microsecond pulses to create electron rich sheaths at the extraction aperture 140. This method produces enhanced heating of the extraction plate 103, which may prevent coating and whisker growth. This heat is transferred to the surrounding gas, which in turn affects the ion-neutral and electron-neutral collisions. The additional heating occurs without increasing the thermal load of the system. The application of a positive voltage with addition of short negative pulses enhances the cross-diffusion of electrons within the arc chamber proximate the extraction aperture 140. The frequency and duty cycle of the pulsed voltage should be such that dc extraction is not perturbed. When nanosecond pulses (<10 ns rise time) are used, deposition can be controlled. The nanosecond pulses may modulate the ratio of ionization to dissociation and other plasma parameters. While FIG. 6 shows only negative pulses, it is understood that positive pulses, such as those shown in FIG. 5 may also be used with the enhanced operating mode shown in FIG. 6.

Figure 7:
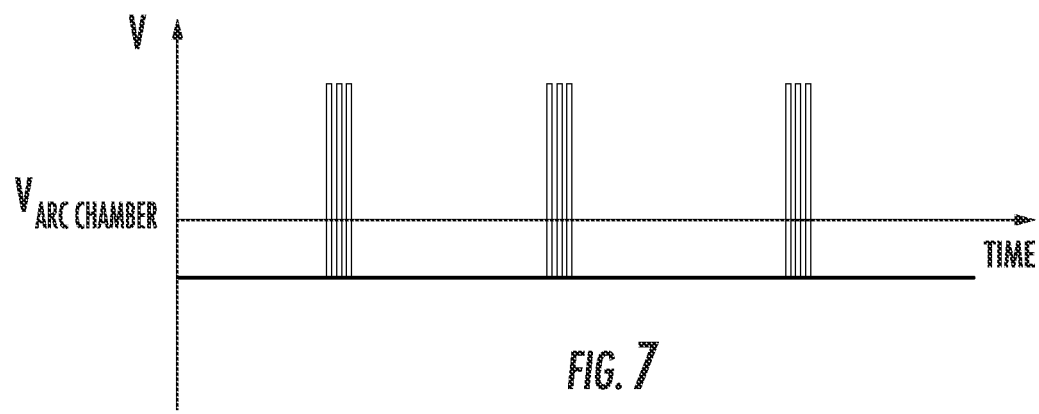
FIG. 7 shows a timing diagram showing the conditioning of an IHC ion source while ions are being extracted according to another embodiment.

In yet another embodiment, the default voltage applied to the extraction plate 103 may be negative, which provides continuous cleaning of the extraction plate. Short positive pulses, as shown in FIG. 7, may be used to condition the IHC ion source 10.

As stated above, the pulsed DC voltages used during the cleaning mode may be provided while ions are being extracted from the arc chamber 100. In other embodiments, the voltage applied to the electrode 200 is modified so that ions are not extracted from the arc chamber 100 during the cleaning mode.

Note that in the embodiments shown in FIGS. 3-8, the extraction plate 103 is biased at a negative voltage relative to the body for some duration of time.

While FIGS. 3-8 show pulsed DC voltages, other embodiments are also possible. For example, pulsed sinusoidal or RF voltages may be used to create the pulses shown in these figures.

Figure 8:
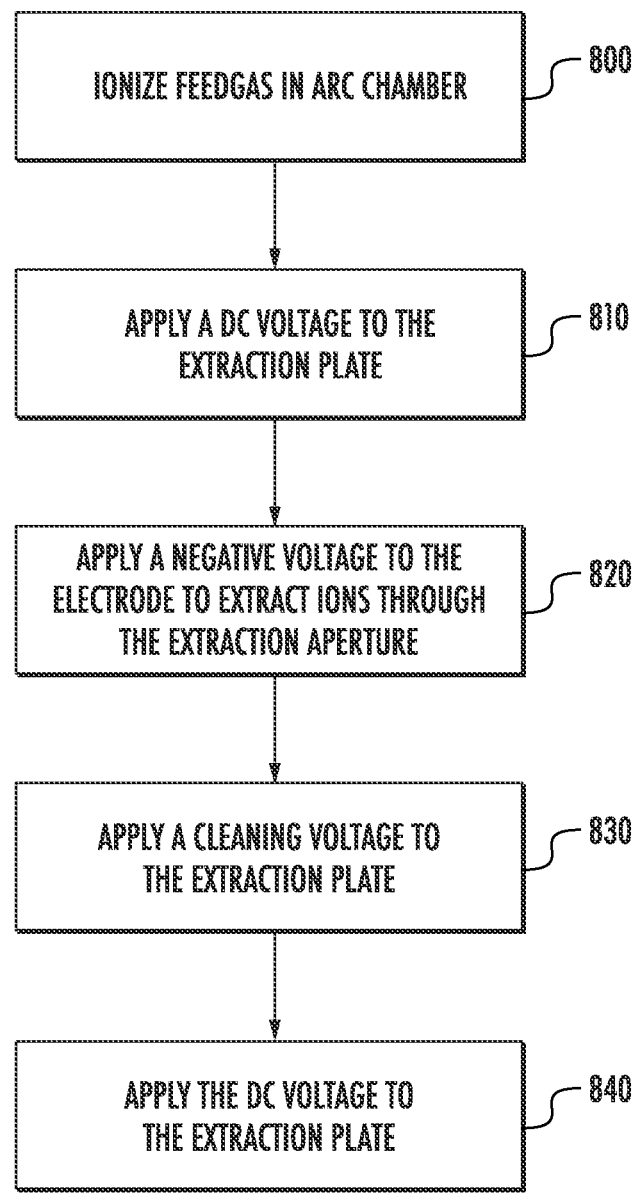
FIG. 8 shows a method of cleaning the IHC ion source in one embodiment.

The operation of the IHC ion source 10 is described in FIG. 8. First, a feedgas is ionized in the arc chamber 100, as shown in Process 800. A DC voltage is applied to the extraction plate 103, as shown in Process 810. In certain embodiments, this is performed prior to the ionization of the feedgas. This DC voltage may be 0 V relative to the body (i.e. conventional operating mode), or may be a positive voltage (i.e. enhanced operating mode). A negative voltage is then applied to the electrode 200 to extract ions through the extraction aperture 140, as shown in Process 820. At this time, the IHC ion source 10 creates ions that are extracted through the extraction aperture 140 and used for ion implantation.

After an interval of time, a cleaning process may be desired. This may be achieved by applying a cleaning voltage to the extraction plate 103, as shown in Process 830. As described above, in certain embodiments, the cleaning voltage is a negative DC voltage. In other embodiments, the cleaning voltage is a pulsed DC voltage which transitions between a negative voltage, which may be between −100V and −1000V, and a second voltage, as shown in FIGS. 3-6. In other embodiments, the cleaning voltage is a pulsed sinusoidal or RF voltage. This second voltage may be the same voltage as is applied to the body of the arc chamber, as shown in FIG. 3. Alternatively, this second voltage may be a positive voltage, as shown in FIGS. 4-6. In some embodiments, this second voltage is the voltage applied to the extraction plate 103 during Process 810, as shown in FIG. 3 and FIG. 6.

If the negative voltage being applied to the electrode is not modified, ions will continue to be extracted during Process 830. However, if ion implantation is to be inhibited during the cleaning mode, the voltage being applied to the electrodes 200 may be modified prior to Process 830.

When the cleaning mode is complete, the DC voltage is again applied to the extraction plate 103, as shown in Process 840. If ion implantation had previously been inhibited, the negative voltage can be restored to the electrode 200 after Process 840.

While the above description describes the use of a separately biased extraction plate 103 with an IHC ion source 10, other embodiments are also possible. The ion source may also be a capacitively coupled plasma generator, a Bernas source, an inductively coupled plasma generator.

Figure 11:
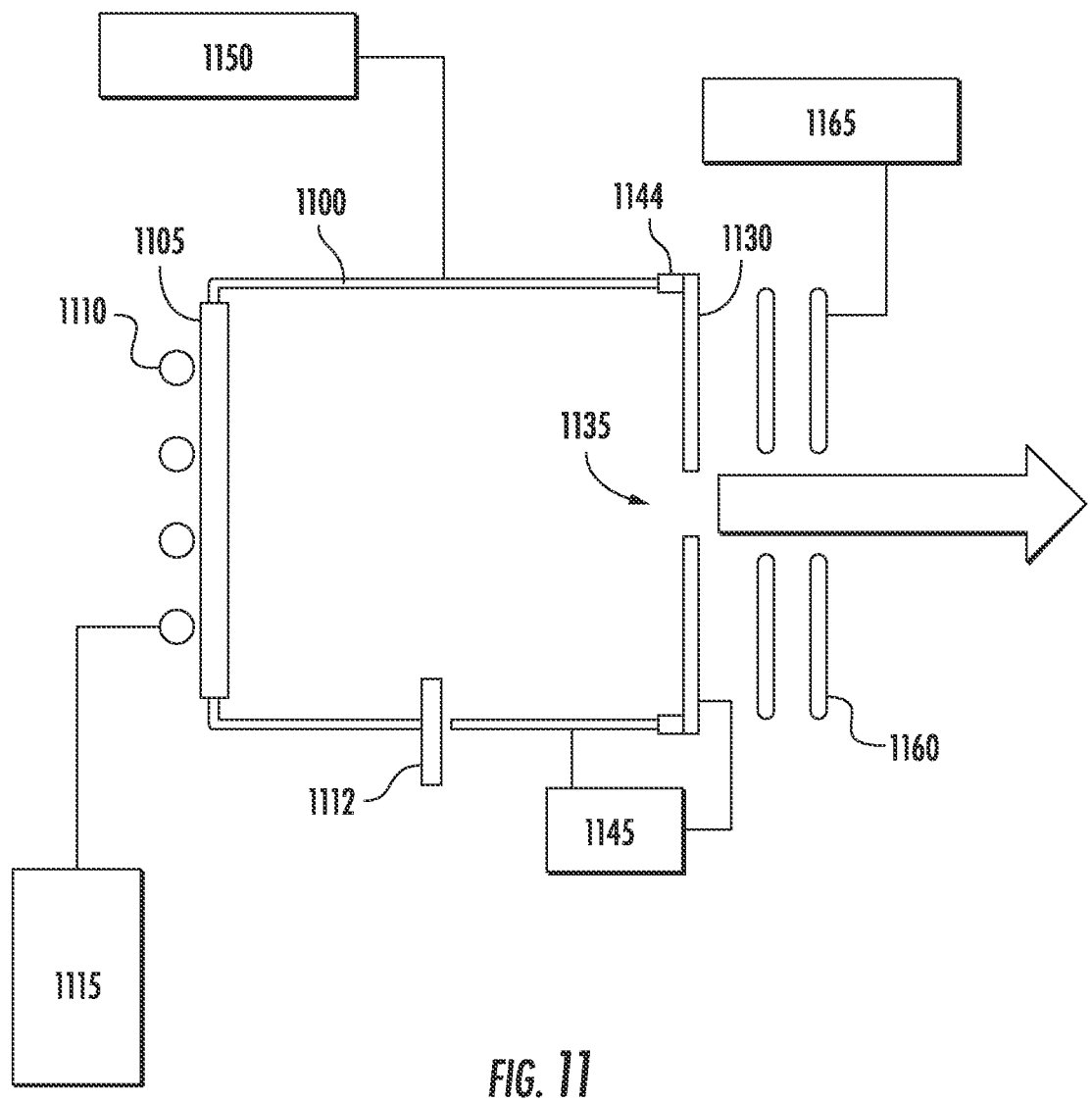
FIG. 11 shows an ion source according to another embodiment.

For example, as shown in FIG. 11, the system may include a plasma chamber, wherein RF energy is introduced into the chamber using an antenna. An antenna 1110 is disposed external to a plasma chamber 1100, proximate a dielectric window 1105. The antenna 1110 is electrically connected to a RF power supply 1115, which supplies an alternating voltage to the antenna 1110. The voltage may be at a frequency of, for example, 2 MHz or more. While the dielectric window 1105 and antenna 1110 are shown on the side of the plasma chamber 1100, other embodiments are also possible. For example, the antenna 1110 may surround the chamber sidewalls. The chamber walls of the plasma chamber 1100 may be made of an electrically conductive material, such as graphite. These chamber walls may be biased at an extraction voltage, such as by power supply 1150. The chamber walls and the dielectric window 1105 define the body of the plasma chamber 1100.

The plasma chamber 1100 includes an extraction plate 1130 having an extraction aperture 1135. The extraction plate 1130 is electrically isolated from the body of the plasma chamber 1100 using isolators 1144. The extraction plate 1130 may be disposed on the side of the plasma chamber 1100 opposite the dielectric window 1105, although other configurations are also possible.

The extraction plate 1130 is independently biased using extraction power supply 1145. In certain embodiments, the extraction power supply 1145 is referenced to the body of the plasma chamber 1100. The extraction power supply 1145 may be a bipolar direct current (DC) power supply, capable of supplying voltages to the extraction plate 1130 that are positive or negative with respect to the body of the plasma chamber 1100. In certain embodiments, the extraction power supply 1145 may supply pulsed DC voltages or pulsed RF voltages to the extraction plate 1130.

As described above, one or more electrodes 1160 may be disposed outside the plasma chamber 1100 proximate the extraction aperture 1135. When a negative voltage is applied to the electrodes 1160, positive ions from within the plasma ion source are accelerated through the extraction aperture 1135 and toward the workpiece, which is located downstream from the electrodes 1160. Each electrode may be a single electrically conductive component with an aperture disposed therein. The electrodes 1160 may be an electrically conductive material, such as tungsten, molybdenum, titanium or graphite. An electrode power supply 1165 may be used to bias the one or more of the electrodes 1160 relative to the body of the plasma chamber 1100 so as to attract ions through the extraction aperture 1135.

In operation, the antenna 1110 is powered using a RF signal from the RF power supply 1115 so as to inductively couple energy into the plasma chamber 1100. This inductively coupled energy excites the feedgas introduced via gas inlet 1112, generating a plasma. When the electrodes 1160 are negatively biased, positive ions are extracted through the extraction aperture 1135. The gradient of the plasma potential may be affected mainly at the region near the extraction plate 1130 by using the extraction power supply 1145 to supply a voltage to the extraction plate 1130 that is different from the voltage applied to the plasma chamber by the power supply 1150. Thus, this ion source can operation in a plurality of modes, including cleaning mode, enhanced operating mode and conventional operating mode, by manipulating the voltage applied to the extraction plate 1130, as described above. While FIG. 11 shows the entire extraction plate 1130 as being electrically conductive, the extraction plate may also be as shown in FIGS. 10A-10B.

The embodiments described above in the present application may have many advantages. First, it is known that the plasma density within an arc chamber decreases as distance from the center 108 of the arc chamber 100 increases. By electrically isolating the extraction plate, a positive voltage may be applied to the extraction plate 103. This positive voltage causes increased collisions in the region near the extraction plate 103. This results in increased plasma density near the extraction plate 103. As stated above, in one test, an increase in plasma density of over 100% was measured when the extraction plate 103 was based at 60V relative the body of the arc chamber 100.

Additionally, the application of a negative voltage to the extraction plate causes ions to collide with the extraction plate 103. This increases the temperature of the extraction plate and also sputters any depositions that are disposed on the extraction plate.

Furthermore, through the application of a pulsed voltage to the electrically isolated extraction plate, it is possible to extract ions from the arc chamber while also cleaning the interior of the arc chamber.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
    a chamber, comprising:
        a body comprising a plurality of walls; and
        an extraction plate comprising an extraction aperture through which ions are extracted from within the chamber, electrically isolated from the body, wherein the body and the extraction plate form a closed volume; and
    an extraction power supply in communication with the extraction plate, wherein the extraction power supply is a bipolar power supply that supplies a pulsed voltage to the extraction plate during operation.

2. The ion source of claim 1, wherein the extraction power supply supplies a pulsed DC voltage to the extraction plate.

3. The ion source of claim 1, wherein the extraction power supply supplies a pulsed RF voltage to the extraction plate.

4. The ion source of claim 1, further comprising a controller in communication with the extraction power supply to allow the ion source to operate in a plurality of modes.

5. The ion source of claim 4, wherein one of the plurality of modes comprises a cleaning mode, wherein during the cleaning mode, the extraction power supply supplies a negative voltage and ions from within the chamber bombard the extraction plate.

6. The ion source of claim 5, further comprising an electrode disposed outside the chamber and proximate the extraction aperture, wherein the electrode is negatively biased relative to the chamber during the cleaning mode such that ions are extracted through the extraction aperture during the cleaning mode.

7. The ion source of claim 4, wherein one of the plurality of modes comprises an enhanced operating mode.

8. The ion source of claim 7, wherein a plasma density at the extraction aperture is increased by at least 30% during the enhanced operating mode.

9. An ion source, comprising:
    a chamber, comprising:
        a body comprising a plurality of walls, wherein the body is electrically conductive; and
        an extraction plate comprising an extraction aperture through which ions are extracted from within the chamber, at least a portion of which is electrically conductive and electrically isolated from the body, wherein the body and the extraction plate form a closed volume; and
    an extraction power supply in communication with the at least a portion of the extraction plate, and that supplies a pulsed voltage to the at least a portion of the extraction plate during operation; wherein the extraction power supply supplies a negative voltage for a duration of time.

10. The ion source of claim 9, further comprising an indirectly heated cathode disposed in the chamber.

11. The ion source of claim 10, wherein the indirectly heated cathode is electrically connected to the body.

12. The ion source of claim 9, further comprising a controller in communication with the extraction power supply to allow the ion source to operate in a plurality of modes.

13. The ion source of claim 12, wherein one of the plurality of modes comprises a cleaning mode, wherein during the cleaning mode, the extraction power supply supplies the negative voltage and ions from within the chamber bombard the extraction plate.

14. The ion source of claim 13, further comprising an electrode disposed outside the chamber and proximate the extraction aperture, wherein the electrode is negatively biased relative to the chamber during the cleaning mode such that ions are extracted through the extraction aperture during the cleaning mode.

15. The ion source of claim 12, wherein one of the plurality of modes comprises an enhanced operating mode.

16. The ion source of claim 15, wherein a plasma density at the extraction aperture is increased by at least 30% during the enhanced operating mode.

17. The ion source of claim 9, wherein the portion of the extraction plate is exposed and a remainder of the extraction plate facing an interior of the closed volume is coated or covered with a dielectric material.

18. The ion source of claim 9, wherein the extraction plate comprises a nonconductive plate, having a central opening, affixed to the body and an electrically conductive plate having the extraction aperture disposed in the central opening, wherein the at least a portion of the extraction plate comprises the electrically conductive plate.

19. An ion source, comprising:
a chamber, comprising:
a body comprising a plurality of walls; and
an extraction plate comprising an extraction aperture through which ions are extracted from within the chamber, electrically isolated from the body, wherein the body and the extraction plate form a closed volume, and wherein the extraction plate comprises an electrically conductive portion proximate the extraction aperture and exposed to an interior of the closed volume, and wherein a remainder of the extraction plate facing the interior of the closed volume comprises a non-conductive material; and
an extraction power supply in communication with the electrically conductive portion of the extraction plate that supplies a pulsed voltage to the electrically conductive portion of the extraction plate during operation, wherein application of a voltage to the electrically conductive portion of the extraction plate, different from a voltage applied to the body, modifies a gradient of a plasma potential in a vicinity of the extraction aperture.

20. The ion source of claim 19, wherein the extraction power supply provides a pulsed DC or pulsed RF voltage to the electrically conductive portion.

* * * * *